United States Patent [19]
McClure

[11] Patent Number: 5,946,264
[45] Date of Patent: Aug. 31, 1999

[54] METHOD AND STRUCTURE FOR ENHANCING THE ACCESS TIME OF INTEGRATED CIRCUIT MEMORY DEVICES

[75] Inventor: David Charles McClure, Carrollton, Tex.

[73] Assignee: STMicroelectronics, Inc., Carrollton, Tex.

[21] Appl. No.: 09/183,231

[22] Filed: Oct. 30, 1998

[51] Int. Cl.[6] .................................................. G11C 7/00
[52] U.S. Cl. ................ 365/230.06; 365/203; 365/189.11
[58] Field of Search .......................... 365/189.11, 189.06, 365/230.06, 203

[56] References Cited

U.S. PATENT DOCUMENTS

| | | | |
|---|---|---|---|
| 5,784,329 | 7/1998 | Blankenship et al. | 365/230.06 |
| 5,805,515 | 9/1998 | Suzuki | 365/230.06 |
| 5,867,437 | 2/1999 | Massoumi et al. | 365/203 |

*Primary Examiner*—Vu A. Le
*Attorney, Agent, or Firm*—Theodore E. Galanthay; Lisa K. Jorgenson; Renee M. Larson

[57] ABSTRACT

A memory structure features a write driver circuit that is controlled to assist equilibrate devices recover one or more bitlines attached to a memory cell following the completion of a write operation of the memory cell. After the write operation, a write bus true and a write bus complement generated by the write driver are coupled to bitlines and equilibration devices by passgates controlled by a control signal.

24 Claims, 3 Drawing Sheets

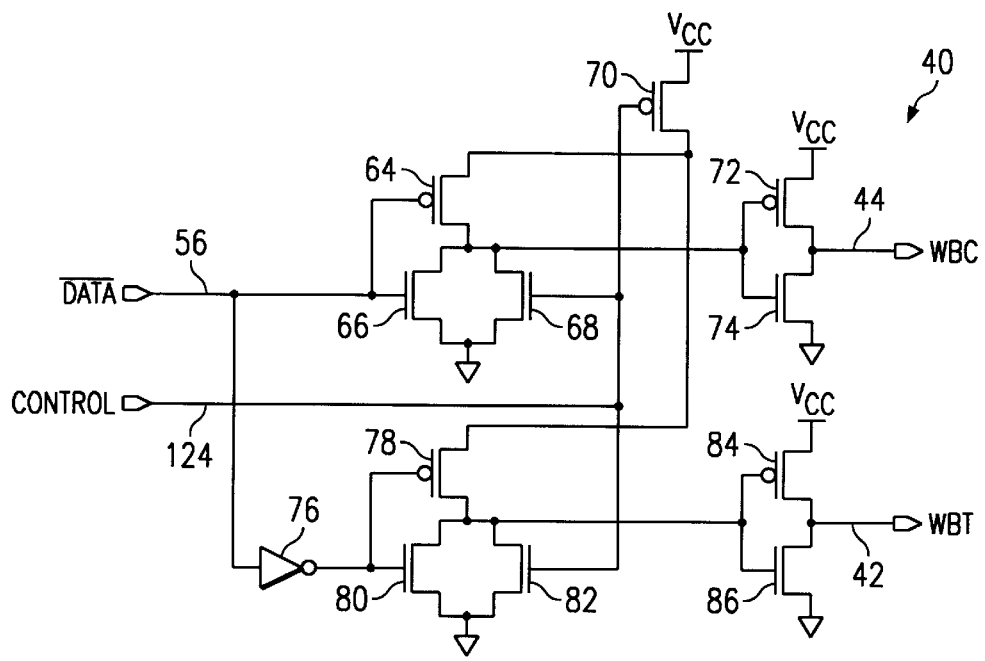
FIG. 3
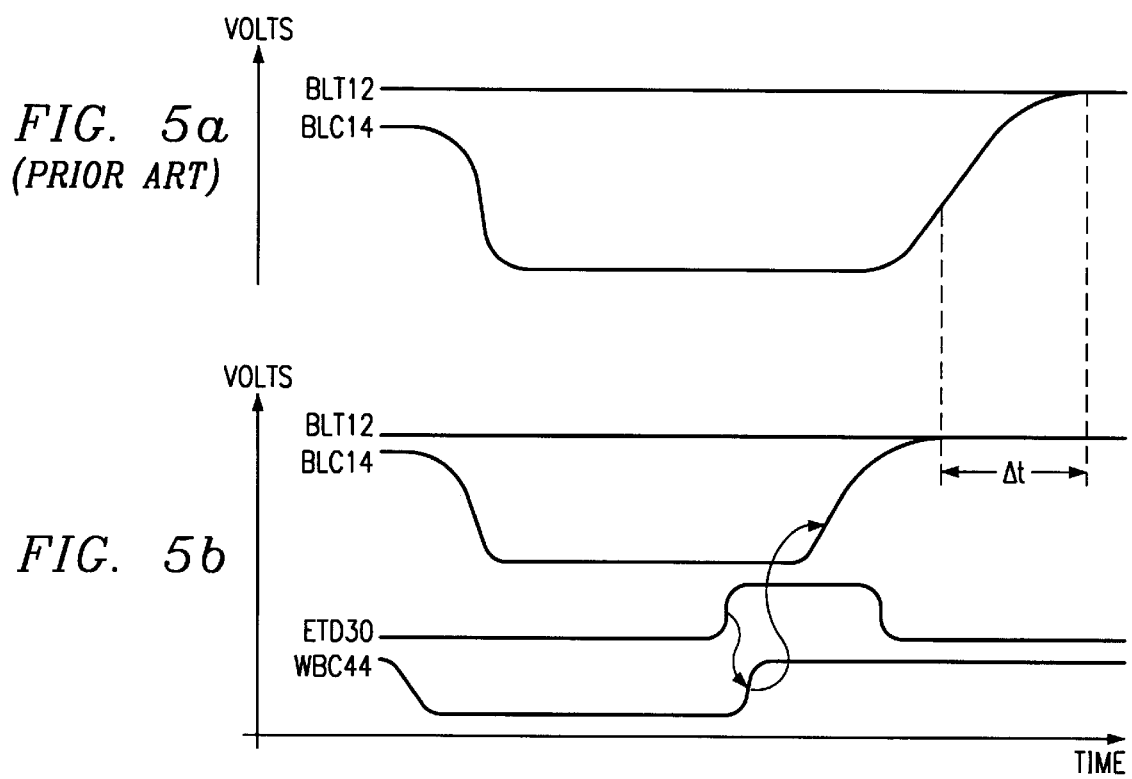
FIG. 5a
(PRIOR ART)
FIG. 5b

METHOD AND STRUCTURE FOR ENHANCING THE ACCESS TIME OF INTEGRATED CIRCUIT MEMORY DEVICES

BACKGROUND OF THE INVENTION

1. Field of the Invention

This invention relates generally to integrated circuit memory device, and, more particularly, to enhancing the access times of such integrated circuit memory devices.

2. Background of the Invention

Often one of the limitations in the access time for memory devices having bitlines, such as Random Access Memories (RAMs), Static Random Access Memories (SRAMs) and nonvolatile memories like Erasable Programmable Read Only Memories (EPROMs), Erasable Programmable Read Only Memories (EEPROMs), and Flash EPROMs, is the recovery time of the bitlines at the end of a write operation that characterizes such devices. During a write operation of a SRAM, for instance, one bitline of the bitline pair is typically pulled to a low logic state while the other bitline of the bitline pair remains at a high logic state. At the end of the write operation, the bitline that is a low logic state is pulled to the high logic state by equilibrate circuitry so that the bitline true and complement of the bitline pair are shorted together. This shorting together of the bitlines of the bitline pair and pulling them to a supply voltage, such as Vcc, is referred to as the "recovery" of the bitlines.

An example of a memory structure 10, with one or more memory cells and associated circuitry is illustrated in the schematic diagram of FIG. 1. In this example, memory structure 10 is representative of a SRAM with the differential bitline pair 12, 14. Memory cells 16 reside between bitline true (BLT) 12 and bitline complement (BLC) 14 and includes n-channel pass transistor 17 having a source/drain path connected on one side to bitline true 12 and n-channel transistor 18 having a source/drain path connected on one side to bitline complement 14. The gates of pass transistors 17 and 18 are connected to and controlled by wordline signal 19. The drains of n-channel cell transistors 20, 22 are connected to the second side of the source/drain paths of pass transistors 17, 18, respectively; in cross-coupled fashion, the drain of cell transistor 20 is connected to the gate of gate of cell transistor 22, and vice versa. The sources of cell transistors 20, 22 are biased to ground. Memory cell node 21 is defined as the electrical connection of the drain of cell transistor 20 and the gate of cell transistor 22, and memory cell node 23 is defined as the electrical connection of the drain of cell transistor 22 and the gate of cell transistor 20. While a 4-T memory cell 16 is shown in FIG. 1, other types of memory cells, such as 6-T memory cells or memory cells with only one bitline, may be used.

In conjunction with memory cells 16, memory structure 10 also features column passgates 36, 38, 46 and 48. Bitline true pass transistor 36 and bitline complement pass transistor 38 have source/drain paths connected on a first side to bitline true 12 and bitline complement 14, respectively, and gates connected to and controlled by column decode signal 32. The source/drain path of pass transistor 36 is connected a second side to write driver circuitry 40 via write bus true (WBT) 42 and the source/drain path of pass transistor 38 is connected on its other side to write driver circuitry 40 via write bus complement (WBC) 44. A first source/drain of bitline true pass transistor 46 is coupled to BLT 12 and a second source/drain is coupled to sense amplifier circuitry 50 via read bus true (RBT) 54. A first source/drain of bitline complement transistor 48 is coupled to BLC 14 and a second source/drain is coupled to sense amplifier circuitry 50 via read bus complement (RBC) 52. The gates of column passgates 46, 48 are controlled by signal 35, the inverse of column decode signal 32 generated as an output signal of inverter 34.

The column of memory structure 10 is selected upon column decode signal 32 being driven to a high logic level (1), turning on pass transistors 36, 38. Writes according the Data 56 provided to Write Driver 40 may then be accomplished by appropriate manipulation of WBT 42 and WBC 44 by Write Driver 40, and thus of column passgates 36, 38 and BLT 12 and BLC 14, when wordline 19 is a high logic level. Either BLT 12 or BLC 14 of the differential bitline pair is pulled low (0) while the other bitline remains high (1) for the duration of the write operation.

After the write operation, wordline 19 is turned off and the bitline that was pulled low is now pulled to a high logic level and the bitline pair is typically shorted together and pulled to Vcc. Equilibration transistor devices 24, 26, and 28 assist in this recovery of the differential bitline pair. Equilibration transistors 24, 28 each have a first source/drain that is coupled to voltage supply Vcc; a second source/drain of 24 is coupled to BLT12 and equilibration transistor 26 and a second source/drain of 28 is coupled to BLC 14 and equilibration transistor 26 as shown. The gates of equilibration transistors 24, 26, and 28 are connected to and controlled by edge transition detection (ETD) signal 30. ETD signal 30 is generated in response to the transition of some external memory signal, such as an address signal or a control signal supplied to the memory device. Upon the ETD signal 30 transitioning to a true logic state (0), equilibrate devices 24, 26, 28 are controlled to pull up the bitline that went to a logic low level for the duration of the write operation.

Recovery of the bitlines of a memory device is slowed considerably by the capacitance of the bitlines. Bitlines of a contemporary SRAM device, for instance, may each be characterized as having capacitance of approximately 1 pF to 4 pF or more. The equilibrate transistors of the memory device assist to pull up the low bitline but their relatively small size, on the order of approximately 5 microns, for instance, may delay the time required to pull-up a bitline characterized as having the capacitance noted above. What is needed in the art is to be able to more quickly recover the differential bitline pair following the completion of a write operation so as to enhance the access time of the memory device.

SUMMARY OF THE INVENTION

According to the principles of the present invention, a memory structure and method is disclosed that is capable of more quickly recovering one or more bitlines following a write operation than the prior art, thereby providing favorable improvements in access time of the memory structure. The memory structure includes a memory cell coupled to one or more bitlines of the memory structure, one or more equilibrate devices that are coupled to the bitlines and controlled by an edge transition detection control signal to recover bitlines from a first logic state to a second logic state following completion of a write operation to the memory cell, passgates coupled to the one or more bitlines and controlled by a column control signal, and a write driver coupled to the one or more passgates that receives a data input and a drive control signal. Following the completion of the write operation to the memory cell, the column control signal causes the write driver to be coupled to the one or more bitlines and the write driver is controlled by the control signal to assist the one or more equilibrate devices recover the one or more bitlines from the first logic state to the second logic state. The write driver has drive elements, typically with a larger drive capability than the equilibrate device, that greatly assist in the recovery of the bitlines, thereby reducing the access time of the memory structure.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawings, wherein:

FIG. 3 is schematic diagram of the write driver illustrated in FIG. 2, according to the present invention;

FIG. 5a is a timing diagram of bitline recovery, according to the prior art; and FIG. 5b is a timing diagram of bitline recovery, according to the present invention.

DESCRIPTION OF THE INVENTION

Figure 1:
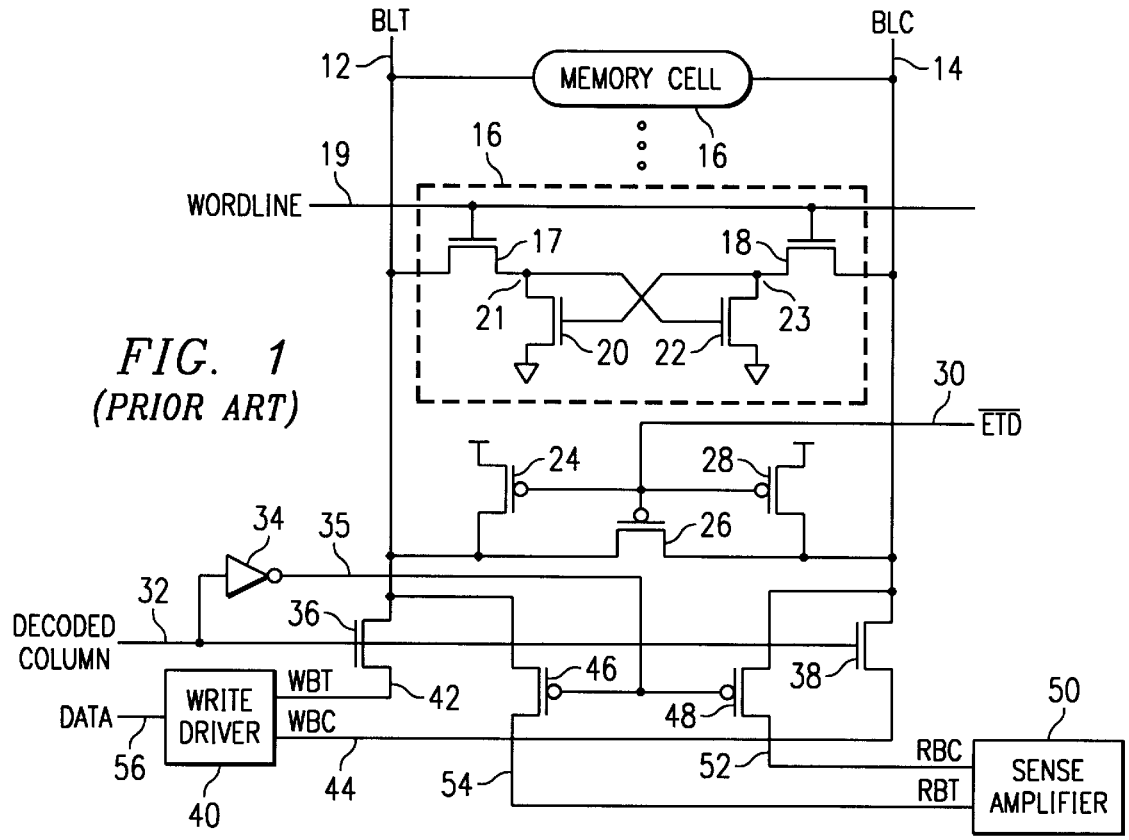
FIG. 1 is a memory structure of an integrated circuit memory device, according to the prior art.
Figure 2:
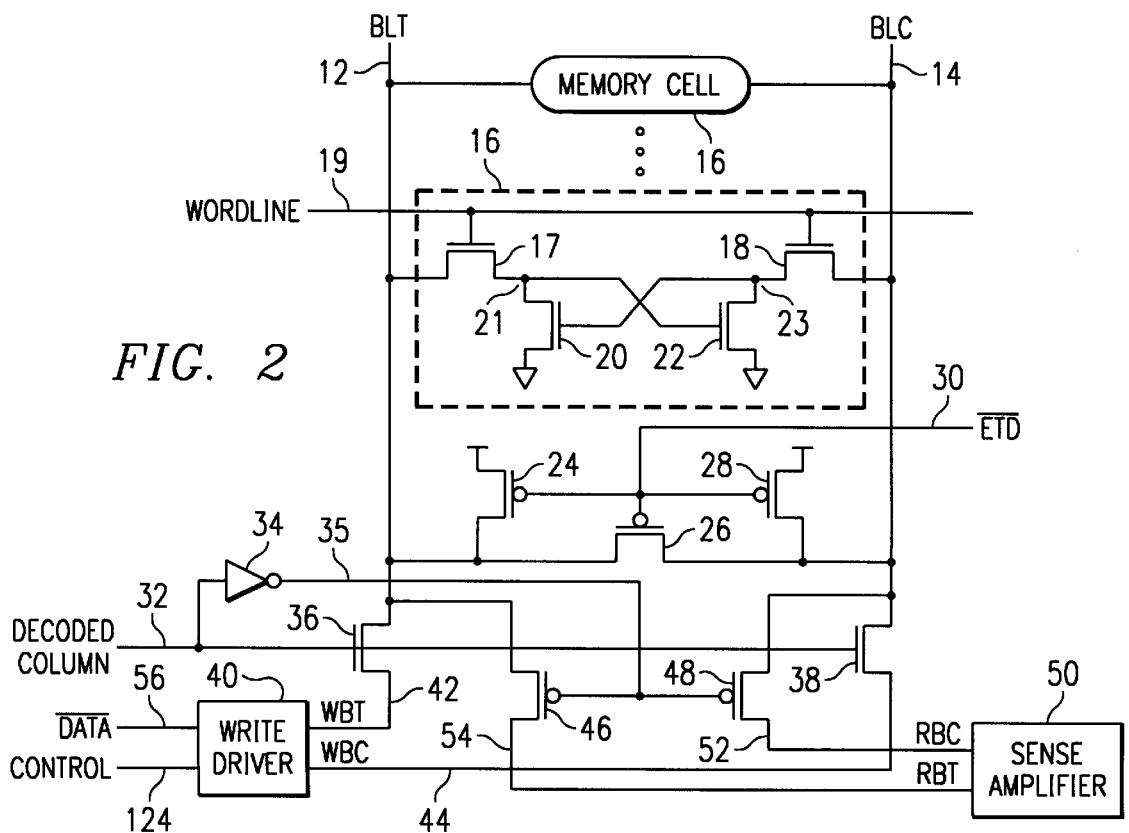
FIG. 2 is a memory structure of an integrated circuit memory device, according to the present invention.

Referring to FIG. 2, a memory structure 10 according to the present invention is shown. Memory structure 10 differs from that of FIG. 1 in that write driver circuit 40 is controlled by control signal 124 to help drive the bitline brought low during a write operation to a high logic level following completion of the write operation. It is desirable that write driver 40 helps equilibrate devices 24, 26, 28 pull up the bitline since the transistors of write driver 40 are much larger than those of devices 24, 26,28 and so much better suited to more quickly overcoming the capacitance of the bitline, as will be described hereinbelow. In order for write driver 40 to help pull up the bitline to a high logic level, the decoded column signal 32 must remain high so that write driver 40 is coupled to the differential bitline pair 12, 14.

Figure 4:
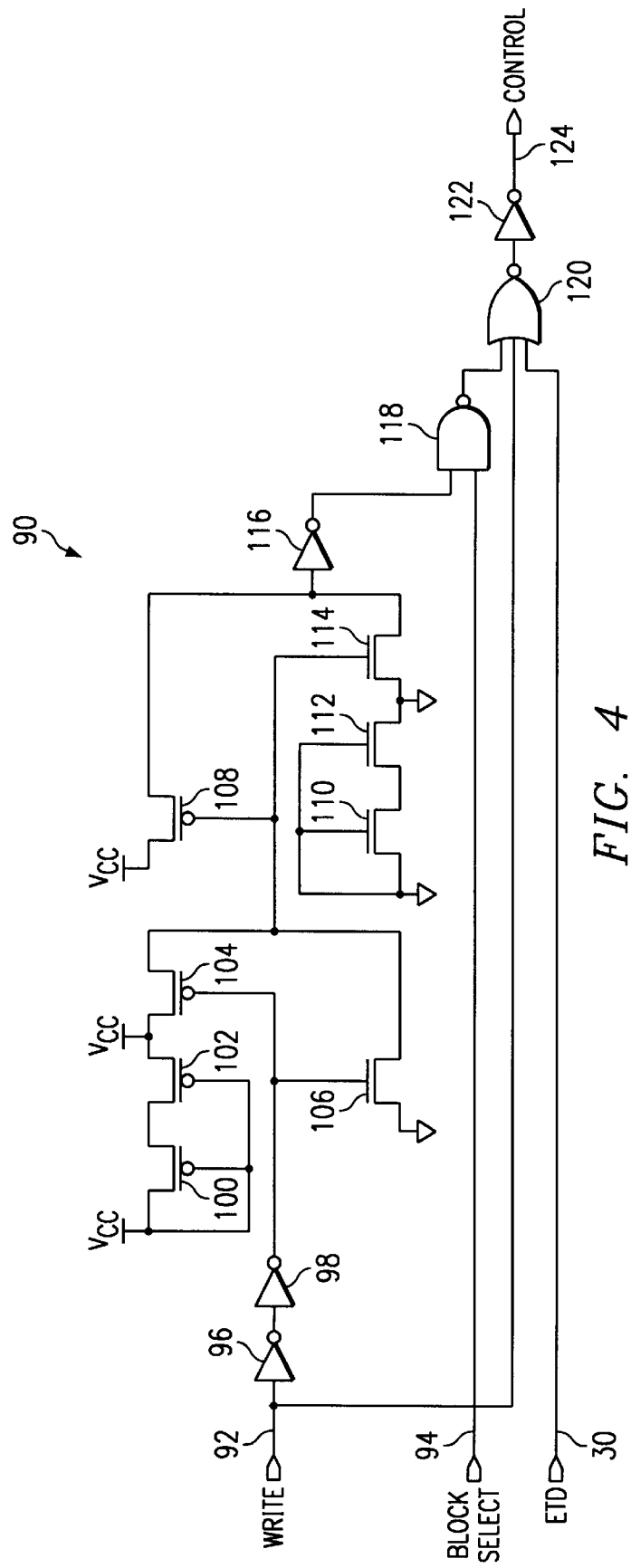
FIG. 4 is a schematic diagram of control circuitry that generates the control signal illustrated in FIG. 2, according to the present invention.

Write driver 40 is illustrated in more detail in FIG. 3. In FIG. 3, write driver circuitry 40 receives data signal 56 and control signal 124 as input signals; control signal 124 is generated by control circuitry 90 as shown in FIG. 4 and is derived from ETD signal 30, write control signal 92, and block select signal 94. As previously mentioned, ETD signal 30 is generated off the transition of a signal external to the memory device, such as an address signal or an external control signal supplied to the memory device. Write control signal 92, in conjunction with decoded column signal 32 and wordline 19, controls when a write operation occurs. Block select signal 94 controls whether the block of the memory device containing the memory structure 10 is selected. Referring now to FIG. 4, it can be seen that control circuitry 90 receives write control signal 92, block select signal 94, and ETD signal 30 as input signals. NAND gate 118 receives both write control signal 92 and block select signal 94 to generate a signal that is provided to NOR gate 120. The circuitry comprised of inverters 96, 98, 116 and transistors 100, 102, 104, 106, 108, 110, 112, 114 serves to introduce a delay to write control signal 92 before it is presented to NAND gate 118. The signal generated by NAND gate 118, write control signal 92, and ETD signal 30 are presented to NOR gate 120, the output signal of which is inverted by inverter 122 to produce control signal 124. Control signal 124 is utilized by write driver circuit 40 in the manner demonstrated in FIG. 3 to generate WBT signal 42 and WBC signal 44.

During a write operation, control signal 124 will be a low logic level (0). At the end of the write, ETD pulse 30 is generated off the first edge transition of the relevant external control signal occurring after the end of the write operation. This causes both WBC 44 or WBT 42 to be driven high by inverter transistors 72, 74 and 84, 86, respectively. The NOR gate function provided by transistors 64, 66, 68, 70, 78, 80, 82 and inverter 76 operate to select the appropriate inverter; if BLT 12 is to be pulled-up to the high logic level, then the NOR function ensures that the inverter driver comprised of transistors 84, 86 drives WBT 42, WBC 44 high and if BLC 14 is to be pulled-up to the high logic level, then the NOR function insures that the inverter driver comprised of transistors 72, 74 drives WBT 42, WBC 44 high. The ETD pulse 30 occurs before the decoded column signal 32 can change back to a low logic state following the write completion, thereby helping to recover the bitline that was low during the write operation to a voltage level defined by Vcc-Vtn, wherein Vtn is the transistor voltage of the n-channel column passgate coupled to the bitline sought to be recovered. The p-channel equilibration devices 24, 26, 28 recover the low bitline to be recovered the rest of the way to the high logic level represented by Vcc.

Because ETD pulse 30 is generated off of the first occurring transition of the appropriate external signal, it will always be true that ETD pulse 30 will occur before the decoded column signal 32 has a change to transition to a low logic state, even in a case in which the column address signal transitions first before the write control signal 92 transistions. This feature is useful to avoid disturbing and thus potentially corrupting memory cells where a read operation follows immediately on the heels of a write operation, particularly if the address changes during the write operation. It results in speedup of the memory device and more robust operation.

Write driver circuit 40 is so effective at pulling-up the low bitline to a high logic level because n-channel inverter drive transistors 72, 74, 84, and 86 are so much larger than the p-channel equilibrate devices 24, 26, 28 and thus much better suited for overcoming the capacitance of the bitline sought to be recovered. This size differential makes sense in light of the drive function provided by transistors 72, 74, 84, and 86 and the fact that equilibration devices are typically laid out on column pitch, one per column, whereas the drive transistors do not have this pitch constraint and therefore be much larger in size. For instance, whereas equilibrate transistors 24, 26, 28 may each be on the order of only 5 microns, drive transistors 72, 84 may be 38 microns and drive transistors 74, 86 may be 24 microns. Thus, the larger inverter drive transistors of the write driver 40 operate to pull-up the bitline of interest to Vcc-Vtn and the equilibrate devices need only pull-up the bitline the rest of the way to Vcc, a difference of only Vtn and a voltage easily handled by the equilibrate transistors even where the capacitance of the bitline in question is quite large. The overall effect of the present invention is to ensure that bitline recovery occurs very quickly so as to greatly reduce the access time of the memory device.

The present invention is again demonstrated by making reference to the timing diagrams of FIGS. 5a and 5b. FIG.

5a illustrates the bitline recovery, assuming that it is BLC 14 that is to be recovered, following a write operation according to the prior art structure of FIG. 1 in which there is no ETD control of the write driver 40. Compare this to the improvement of the present invention illustrated in FIG. 5b. Following the completion of the write operation, the ETD pulse 30 transitions from a low to a high logic state, causing the write bus complement 44 to also transition to the high logic state, again assuming that it is the BLC 14 that is to be recovered to the high logic state by operation of the driver transistors 72, 74. This transition in turn causes BLC 14 to transition quickly to the desired Vcc voltage level with the assistance of equilibrate transistors 24, 26, 28. Δt represents the net decrease in access time provided by the present invention and can be on the order of approximately 1 nS to 3 nS for contemporary SRAM memory devices.

While the invention has been particularly shown and described with reference to a preferred embodiment, it will be understood by those skilled in the art that various changes in form and detail may be made therein without departing from the spirit and scope of the invention. For instance, those skilled in the art will recognize that the present invention may be applied to those memory device employing just a single bitline structure rather than the differential bitline pair shown and described herein without departing from the spirit and scope of the invention.

What is claimed is:

1. A memory structure, comprising:

a memory cell coupled to one or more bitlines of the memory structure;

one or more equilibrate devices coupled to the one or more bitlines and controlled by an edge transition detection control signal to recover the one or more bitlines from a first logic state to a second logic state following completion of a write operation to the memory cell;

one or more passgates coupled to the one or more bitlines and controlled by a column control signal;

a write driver coupled to the one or more passgates that receives a data input and a drive control signal;

wherein following completion of the write operation to the memory cell, the column control signal causes the write driver to be coupled to the one or more bitlines and the write driver is controlled by the control signal to assist the one or more equilibrate devices recover the one or more bitlines from the first logic state to the second logic state.

2. The structure of claim 1, wherein the write drive has a plurality of drive elements characterized as having a higher drive capability than the one or more equilibrate devices.

3. The structure of claim 2, wherein the plurality of drive elements are a plurality of transistors.

4. The structure of claim 1, wherein the control signal is determined by the edge transition detection signal.

5. The structure of claim 4, wherein the control signal is determined by both the edge transition detection signal and a write signal of the memory structure.

6. The structure of claim 1, wherein the write driver contains a pull-up capability and a pull-down capability.

7. The structure of claim 6, wherein the pull-up capability is provided by one or more p-channel transistor devices and the pull-down capability is provided by one or more n-channel transistor devices.

8. The structure of claim 1, wherein during the write operation either a write bus true or a write bus complement generated by the write driver is the first logic state and following completion of the write operation the write bus true and the write bus complement are both the second logic state.

9. The structure of claim 8, wherein following completion of the write operation the one or more passgates are controlled by the column control signal to be on and couple the write bus true and the write bus complement to the one or more bitlines.

10. A memory structure, comprising:

a memory cell coupled to one or more bitlines of the memory structure;

one or more equilibrate devices coupled to the one or more bitlines and controlled by an edge transition detection control signal to recover the one or more bitlines from a first logic state to a second logic state following completion of a write operation to the memory cell; and means for assisting the one or more equilibrate devices recover the one or more bitlines to the second logic state following completion of the write operation.

11. The structure of claim 10, wherein the means for assisting comprises a write driver having a plurality of drive elements that is controlled by a control signal to be coupled to the one or more bitlines and to assist the one or more equilibrate devices recover the one or more bitlines to the second logic state following completion of the write operation.

12. The structure of claim 11, wherein the control signal is determined by the edge transition detection signal.

13. The structure of claim 12, wherein the control signal is determined by both the edge transition detection signal and a write signal of the memory structure.

14. The structure of claim 11, wherein the write driver contains a pull-up capability and a pull-down capability.

15. The structure of claim 14, wherein the pull-up capability is provided by one or more p-channel transistor devices and the pull-down capability is provided by one or more n-channel transistor devices.

16. The structure of claim 11, wherein during the write operation either a write bus true or a write bus complement generated by the write driver is the first logic state and following completion of the write operation the write bus true and the write bus complement are both the second logic state.

17. The structure of claim 11, wherein the drive elements are a plurality of drive transistors.

18. The structure of claim 11, wherein the plurality of drive elements are characterized as having a greater drive capability than the one or more equilibrate devices.

19. The structure of claim 11, wherein the memory structure further comprises:

one or more passgates coupled to the one or more bitlines and controlled by a column control signal and the means for assisting is controlled by the column control signal to assist the one or more equilibrate devices recover the one or more bitlines to the second logic state following completion of the write operation.

20. The structure of claim 19, wherein following completion of the write operation the one or more passgates are controlled by the column control signal to be on and couple a write bus true and a write bus complement generated by the write driver to the one or more bitlines.

21. The structure of claim 10, wherein the one or more bitlines are a bitline pair.

22. A method of quickly recovering one or more bitlines of a memory structure to a post-write logic state, comprising the steps of:

performing a write operation of a memory cell of a memory structure; and recovering one or more bitlines coupled to the memory cell from a first logic state to a second logic state by one or more equilibrate devices coupled to the one or more bitlines and by a write driver, having one or more drive elements, that is controlled to be coupled to the one or more bitlines by a control signal following completion of the write operation.

23. The method of claim 22, wherein the one or more drive elements are characterized as having a greater drive capability than the one or more equilibrate devices.

24. The structure of claim 1, wherein the one or more bitlines are a bitline pair.

* * * * *